March 1, 1960 D. R. CURRAN ET AL 2,927,285

HOUSING FOR CERAMIC LADDER FILTER

Filed April 28, 1959

INVENTOR.
DANIEL R. CURRAN
WILLIAM J. GERBER
ANTONIO LUNGO

BY

Jack H Linocott
ATTORNEY 2,927,285
Patented Mar. 1, 1960

2,927,285

HOUSING FOR CERAMIC LADDER FILTER

Daniel R. Curran, Cleveland, William J. Gerber, Willowick, and Antonio Lungo, Cleveland, Ohio, assignors to the United States of America as represented by the Secretary of the Army Application April 28, 1959, Serial No. 809,583

11 Claims. (Cl. 333—72)

The invention described herein relates to electromechanical filters and more particularly to filters incorporating piezoelectric elements.

It has, of course, been common practice in the electrical arts to employ piezoelectric crystals as elements of filter circuits and to connect these elements in various circuit configurations to obtain the desired type of filter. In recent years the development of ferroelectric ceramics has made the basic concept of resonant electromechanical filtering more easily attainable and desirable from an applications standpoint.

Various arrangements have been devised to mechanically secure the crystal resonator elements in place and to make the necessary electrical connections thereto. The present invention relates to this problem of packaging and making of electrical connections to the basic building blocks, the electromechanical resonators, to produce compact high performance filters.

It is an object of the present invention to provide a mounting structure for radial mode piezoelectric ceramic filter discs.

It is a further object of the invention to provide a mounting means to assemble such radial mode piezoelectric discs into an electromechanical filter structure of the ladder type.

It is a still further object of the invention to reduce the generation of spurious responses in the elements of a piezoelectric band pass filter.

Other objects and many attendant advantages of the invention will be readily apparent as the same becomes better understood from the following detailed description and accompanying drawings wherein.

Figure 1:
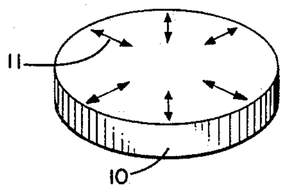
Figure 1 is a schematic drawing of a radial mode resonator utilized in the construction of the filters of this disclosure.

The basic ferroelectric ceramic element 10 as shown in Figure 1 of the drawing may be formed of any of the known ferroelectric materials. For example it may be formed of barium titanate, lead zirconate or cadmium niobate produced in accordance with the teachings of the prior art. As shown, the body 10 is formed as a discoid which is polarized in its axial direction and as indicated by the arrows 11 acts as a radial mode resonator. The details of the production of such ceramic bodies are well known in the prior art and form no part of the present invention. The resonant frequency of the ferroelectric discoid element 10 may be designed in accordance with known principles for the particular filter application under construction.

Figure 2:
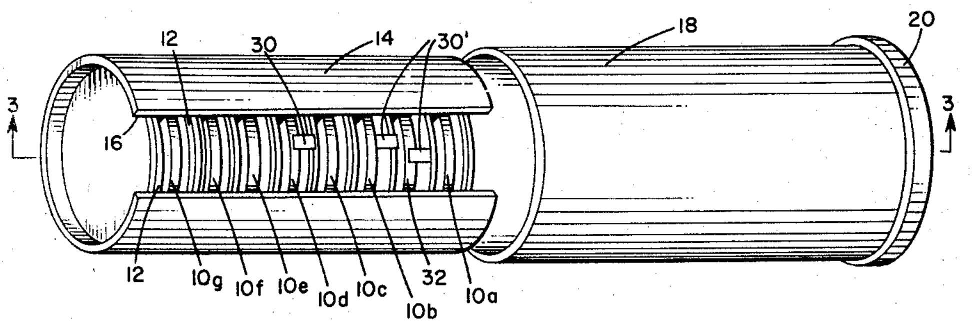
Figure 2 is an exploded perspective view of a filter housing or mounting constructed in accordance with the principles of this invention.

It was discovered that electrical leads could not be conveniently soldered to radial mode discoid bodies such as element 10 described above without the introduction of spurious responses in the element. If, however, the discoid were held at its center by a pair of essentially point contacts, there would be very little effect upon its response characteristics. This discovery was applied in the design of the novel filter holder illustrated in Figure 2.

The outer casing of the holder is formed of a cylindrical shell 18 of brass or other suitable metal of dimensions determined by the size and number of filter elements to be employed. An internal liner element 14 is formed of Bakelite or other suitable electrical insulating material. The liner element 14 is not a complete cylinder but is slotted longitudinally as illustrated to facilitate assembly of the ferroelectric elements and the remaining apparatus to be described.

Another important function of the slot in liner 14 is to provide a relief or clearance space through which jumpers or bus bars may extend to effect the particular electrical connections desired, as hereinafter appears.

Liner 14 is of such diameter as to retain the resonator discoids in position without tightly binding the peripheries thereof. To prevent electrical contact of elements 10 with the inner surface of shell 18, the longitudinal slot in liner element 14 must be closed or covered in some suitable manner. This is conveniently done by covering the slot with a piece of adhesive insulating tape (not shown). Alternatively, slotted liner 14 can be slipped into a larger unslotted tube (not shown) of insulating material prior to insertion into case 18. Another suitable expedient is to apply to the inner surface of case 18 a suitable coating of non-conductive material.

End caps 20 are employed at the ends of the cylindrical shell 18 and may be attached thereto in any convenient fashion. The end caps are preferably formed of insulating material such as glass and have an electrical lead or leads 22 feeding therethrough for connection to the resonator discoids in a manner to be described hereinafter.

A number of discoids, designated 10*a*, 10*b*, 10*c*, 10*d*, etc., are assembled within the liner element 14 but are separated from one another by the spring connector elements 12. Each spring connector element is formed in a broad flat conical shape of slightly larger diameter than the discoid elements it is to be used with. The spring connector elements are formed of metal having the required electrical and mechanical characteristics. Brass or other suitable metal alloys may be used. The spring connector elements 12 are used in pairs, placed base to base between pairs of discoid resonator elements, with the apex of each connector element bearing upon and making electrical contact with the adjacent resonator discoid.

Figure 3:
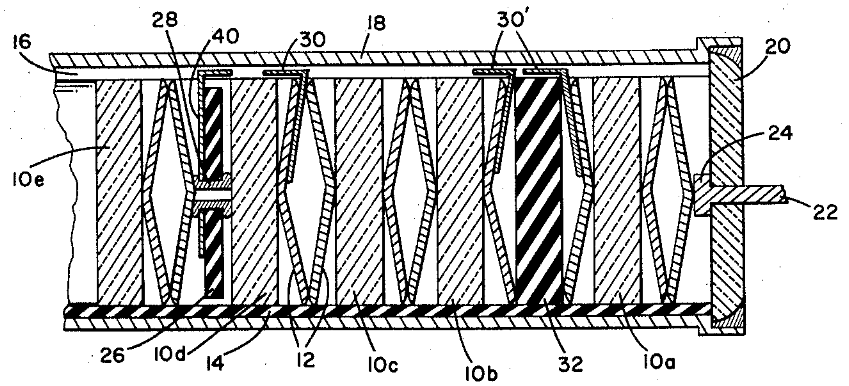
Figure 3 is a partial sectional view taken along the line 3—3 of Figure 2 showng the filter assembled.

Electrical contact between the lead 22 and the end resonator discoid may also be made through the use of spring elements 12. As illustrated in Figure 3 the lead 22 is terminated in an enlarged end or terminal piece 24 which is then connected to the discoid by the spring elements 12.

When the discoid elements are to be connected other than in series, connector members must also be interposed between the discoids. These connector members may be formed to accomplish their desired purpose. Examples are shown in Figure 3 as being of the feed-through type. One of these types takes the form of a conductive tab 30 formed of brass or other suitable material interposed between contiguous spring elements 12 separating discoids 10*c* and 10*d*. Tab 30 may be soldered or otherwise secured to one or the other of the spring elements 12 with which it is associated or it may be retained simply by the spring pressure exerted by elements 12. Conductive tabs such as 30 may be used to form any desired electrical arrangements of the filter elements, as in series-parallel, ladder-type, and the like. The outer terminal portions of these tabs may be insulated if required by the particular circuit connections to be made. Any desired connections may be made by interconnection of tabs 30 directly or with straps or jumpers extending longitudinally and insulated from the peripheries of the resonator discoids 10 and insulated from outer casing 18, or not, as the circuit may require. These longitudinal straps would be secured to the proper tabs 30 by soldering or other appropriate means.

Another feed-through type connector, also shown in Figure 3, takes the form of a disc 26 of insulating material such as Bakelite. A tubular rivet 28 at the center thereof makes an electrical connection between a pair of spring elements 12 and a filter discoid 10*d*. A conductive strap 40 formed of brass or other suitable material is also held by the rivet 28 and extends radially outward along the surface of the insulating disc 26. The conductive strap 40 may be used in the same manner as tab 30 to form any desired electrical arrangements of the filter elements.

It will of course be obvious that the electrical connection between adjacent resonator discoids may be broken by the insertion of an insulating disc having no feed through connection. Such a disc has been illustrated at 32, interposed between spring washers 12 and provided with tabs 30' for circuit connections. Thus, as shown, discoid 10*a*, Figure 3, is isolated from the adjacent discoid 10*b*. It will be appreciated, of course, that Figure 3 does not show or purport to demonstrate any particular circuit connections.

Another end cap (not shown) similar to that shown at 20 may be employed to close the left hand end of the filter structure as shown in Figure 3. It would be placed in the shell 18 after assembly of the appropriate number of resonator discoids and spring and connector elements. The end cap would be pushed in with sufficient force to cause the proper amount of spring compression to insure good mechanical and electrical engagement between the various filter elements. Additional spring means such as coil springs can also be inserted if desired between the end cap and the adjacent spring element 12.

The entire filter unit after assembly may be embedded in a suitable plastic resin (not shown) to electrically insulate its shell 18 and to seal the contents in a moisture-proof manner. Various coatings of this type are well known in the art and form no part of the present invention.

Except for the slotted liner 14, assembly would be extremely difficult in view of the small size of the unit and its components. For example, a typical unit consists of 17 discs and is 5/16" in diameter and 1¼" in length.

The foregoing disclosure relates to a preferred embodiment of the invention. Numerous modifications or alterations may be made therein without departing from the spirit and scope of the invention set forth in the appended claims.

What is claimed is:

1. A piezoelectric ceramic disc assembly comprising a conductive sleeve, an insulating sleeve lining said conductive sleeve and having a longitudinal slot, a plurality of piezoelectric disc means within said insulating sleeve, spring contact means between each pair of adjacent disc means for making contact between the adjacent disc means, and end caps for said sleeves having electrical contacts for connection with the end disc means and electrical leads passing through said caps.

2. A piezoelectric filter assembly comprising a plurality of piezoelectric disc means, a conductive sleeve forming a housing for said assembly, an insulating sleeve lining said conductive sleeve and having a longitudinal slot, spring contact spacers between pairs of adjacent disc means for making electrical contact between the adjacent disc means, and end caps for said sleeves having contacts and electrical leads for connection with the end disc means.

3. The piezoelectric filter assembly of claim 2 in which said spring contact spacers are shallow conical spring discs arranged in pairs between the adjacent disc means with the bases of the discs in contact and with the apices of the discs in contact with the centers of the piezoelectric disc means.

4. A piezoelectric ceramic filter assembly comprising a cylindrical conductive sleeve, an insulating sleeve lining said conductive sleeve and having a longitudinal slot, a plurality of circular piezoelectric disc means longitudinally arranged on a common axis within said sleeve, spring contact means between each pair of adjacent disc means for making electrical contact therebetween and end caps for said sleeves having contacts and electrical leads for connection with the end disc means.

5. The piezoelectric ceramic filter assembly of claim 4 in which each spring contact means comprises a pair of shallow conical spring members arranged on a common axis, each of said spring members having an apex and a base portion, the apex of each of said spring members being in contact with a surface of one of said disc means at its center, and the base portions of said spring members being in electrical contact.

6. The piezoelectric filter assembly of claim 5 including insulating means covering said longitudinal slot.

7. The piezoelectric ceramic filter assembly comprising a cylindrical conductive sleeve, an insulating sleeve lining said conductive sleeve and having a longitudinal slot, a plurality of circular piezoelectric disc means longitudinally arranged on a common axis within said sleeve, spring contact means between each pair of adjacent disc means, said contact means between at least one pair of said disc means including radial connector means comprising a conductive member in electrical contact with an adjacent one of said spring contact means and extending radially outwardly beyond the outer perimeter of said disc members, and end caps for said sleeves having contacts and electrical leads for connection with the end disc means.

8. The piezoelectric ceramic filter of claim 7 wherein said contact means between said pair of said disc means further includes an insulating disc having a rivet through its center in engagement with the center of the adjacent piezoelectric disc means and said radial connector means.

9. The piezoelectric ceramic filter of claim 7 wherein said contact means between another pair of said disc means includes two shallow conical spring members having an apex and a base portion, the apex of each of said spring members being in contact with a surface of one of said disc means at its center, and the base portion of said spring members being in electrical contact, and a tab of conductive material positioned between said base portions and extending radially outwardly from between said base portion into said longitudinal slot.

10. The piezoelectric ceramic filter of claim 9 wherein said contact means between said other pair of disc means further includes an insulating spacer positioned between said base portions.

11. A piezoelectric ceramic disc assembly comprising a sleeve, a plurality of piezoelectric disc means within said sleeve, spring contact means between each pair of adjacent disc means for making contact between adjacent disc means, and end caps for said sleeve having contacts and electrical leads for connection with the end disc means.

No references cited.